United States Patent
Yang

(12) United States Patent    (10) Patent No.: US 7,008,735 B2
Yang    (45) Date of Patent: Mar. 7, 2006

(54) MASK FOR IMPROVING LITHOGRAPHY PERFORMANCE BY USING MULTI-TRANSMITTANCE PHOTOMASK

(75) Inventor: Chih-Cheng Yang, Hsinchu (TW)

(73) Assignee: Macronix International Co., LTD, Hsinchu (TW)

( * ) Notice: Subject to any disclaimer, the term of this patent is extended or adjusted under 35 U.S.C. 154(b) by 179 days.

(21) Appl. No.: 10/653,390

(22) Filed: Sep. 2, 2003

(65) Prior Publication Data

US 2005/0048377 A1    Mar. 3, 2005

(51) Int. Cl.
*G03F 9/00*    (2006.01)

(52) U.S. Cl. .......................................... 430/5
(58) Field of Classification Search .................. 430/5, 430/322, 394; 378/35
See application file for complete search history.

(56) References Cited

U.S. PATENT DOCUMENTS

| | | | |
|---|---|---|---|
| 6,274,281 B1 * | 8/2001 | Chen | 430/5 |
| 6,841,316 B1 * | 1/2005 | Crell | 430/5 |
| 2003/0207183 A1 * | 11/2003 | Kikuchi | 430/5 |

* cited by examiner

*Primary Examiner*—S. Rosasco
(74) *Attorney, Agent, or Firm*—Stout, Uxa, Buyan & Mullins, LLP

(57) ABSTRACT

Materials and methods for fabricating multi-transmittance halftone phase shift masks (HTPSM) are disclosed. The masks include patterns having regions of different transmittance for the purpose of reducing one or more of line edge shortening, iso-to-dense bias, and edge-to-dense bias. The masks employ at least one halftone material in forming the patterns that have different transmittances. Regions of denser or longer lines are constructed to have a lower transmittance than regions of isolated lines. The patterns may include a single halftone material of different thicknesses for different regions or may include two halftone materials applied singly and doubly to different regions.

20 Claims, 8 Drawing Sheets

Simulation data case II (edge to dense bias)
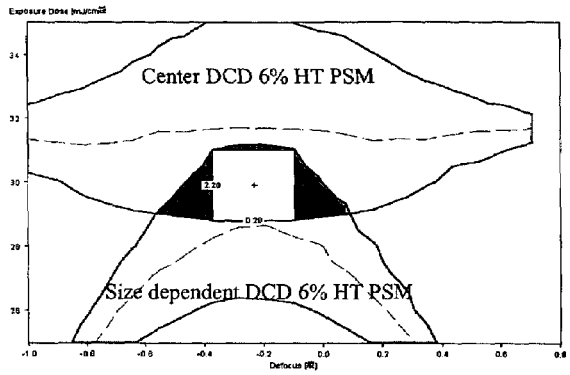
FIG. 8A
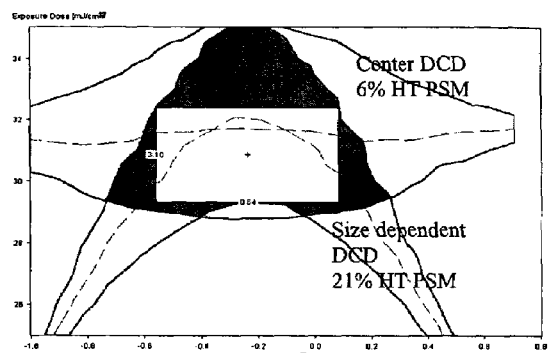
FIG. 8C
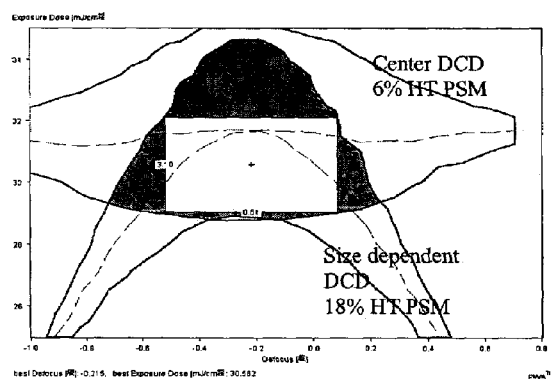
FIG. 8B
The common window will improve from 0.28μm to 0.64μm with multi transmittance mask
FIG. 8

Modify Size Dependent Bias by different transmittance of HTPSM

NA=0.64 S=0.85/0.55
L/S=0.16/0.16
DCD=0.16

Line end shortening by different transmittance of HTPSM

NA=0.64 S=0.85/0.55
0.16μm line to line
Space 0.16μm

MASK FOR IMPROVING LITHOGRAPHY PERFORMANCE BY USING MULTI-TRANSMITTANCE PHOTOMASK

BACKGROUND OF THE INVENTION

1. Field of the Invention

The present invention relates generally to semiconductor manufacturing and, more particularly, to halftone photomasks.

2. Description of Related Art

One of the processing steps used during a semiconductor manufacturing process is photolithography. Photolithography is implemented numerous times during the manufacturing process and is one of the more important as well as one of the more limiting processes for determining a maximum density and final reliability of the integrated circuits. Photolithography can be particularly important in positioning the transistors, interconnect layers and via and in ensuring their uniformity.

A typical photolithographic process is implemented by depositing onto a working surface, by means such as a spinner, a layer of photosensitive resist that can be patterned by exposure to ultraviolet (UV) light or another radiation type. The working surface may be a semiconductor wafer, interconnect layer or other layer depending on the current manufacturing stage of the integrated circuits. The photoresist layer is sensitive to light and may be patterned based on exposing the photoresist to a corresponding pattern of light.

To undergo exposure, the photoresist-covered wafer is placed beneath a photomask designed to prevent the penetration of radiation through certain portions of the photoresist. Predetermined areas of the photoresist then undergo a degree of polymerization or depolymerization, which can be a function of the nature and extent of photoresist exposure.

The photomask forms the pattern by utilizing areas that block the light and other areas that allow the light to pass from the light source to the photoresist layer. The pattern of light created by the photomask is typically for a single die on a wafer. A lens may be positioned between the photomask and the photoresist layer to reduce the size of the pattern and to focus the pattern of light onto the die. The lithography tool steps from one die to the next die on the wafer and repeats the process until all selected die on the wafer have been exposed to the pattern of light created by the photomask.

A chemical bath known as a developer can then be used to dissolve parts of the photoresist that remain relatively depolymerized after the exposure by placing the wafer therein and allowing the wafer to be rinsed for a designated time period. Having received the pattern from the photomask, the layer of photoresist on the wafer is typically referred to as a layer of patterned photoresist. The presence or absence of photoresist across a working surface creates a pattern or template to be used by subsequent processing steps of the integrated circuit. For example, an etching or an ion implantation process may be used after the lithography step on the exposed areas without photoresist to continue the manufacturing process of the integrated circuit.

If there are two patterns with different sizes or different densities on the same mask, line end shortening (LES), corner rounding, iso-to-dense bias and edge-to-dense bias issues may occur on the images translated to the photoresist from the mask.

In order to resolve the foregoing issues, one conventional method involves using two masks and two exposure steps to overcome these issues. The second mask and the second exposure step are used to improve the iso-to-dense bias, the edge-to-dense bias and the line end shortening issue. Since this method needs two masks and two exposure steps, however, it can be complex and expensive. In addition, alignment issues may arise with the use of two masks.

Another conventional method used to address the foregoing issues involves the addition of sub-resolution assist features (SRAFs) to the pattern. SRAFs are small additional features on the mask near for example isolated lines which can be considered to diffract light similarly to that of dense lines. This approach has become an effective way to reduce iso-to-dense bias. As dimensions shrink and line density increases, however, even SRAFs may be too large to fit within a given pattern to effectively reduce for example line end shortening and iso-to-dense bias.

A need thus exists in the prior art to effectively and efficiently reduce issues such as iso-to-line bias for fine line patterns. A further need exists to efficiently and effectively reduce issues such as line end shortening for these fine line structures.

SUMMARY OF THE INVENTION

An apparatus for improving photolithography performance by using a multi-transmittance mask, and in accordance with certain aspects of the invention, by using a multi-transmittance halftone type phase shift photomask (HTPSM), is provided. The mask comprises a transparent substrate, a first pattern and a second pattern formed on the transparent substrate, wherein the second pattern is larger (e.g., longer) or denser than the first pattern, and a transmittance of the first pattern is higher than a transmittance of the second pattern. Iso-to-dense bias and edge-to-dense bias issues may be improved through use of the multi-transmittance masks of the present invention which in turn may provide an improved critical dimension uniformity and/or an improved common window. Accordingly, various implementations of the present invention may provide at least one of a reduced iso-to-dense bias, a reduced edge-to-dense bias, a reduced line end shortening, an improved critical dimension uniformity, and an improved or enlarged common window.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims.

BRIEF DESCRIPTION OF THE FIGURES

FIGS. 8A–C compares the common windows resulting from use of single transmittance masks versus use of multi-transmittance halftone phase shift masks of the present invention.

DETAILED DESCRIPTION OF THE PRESENTLY PREFERRED EMBODIMENTS

Figure 1:
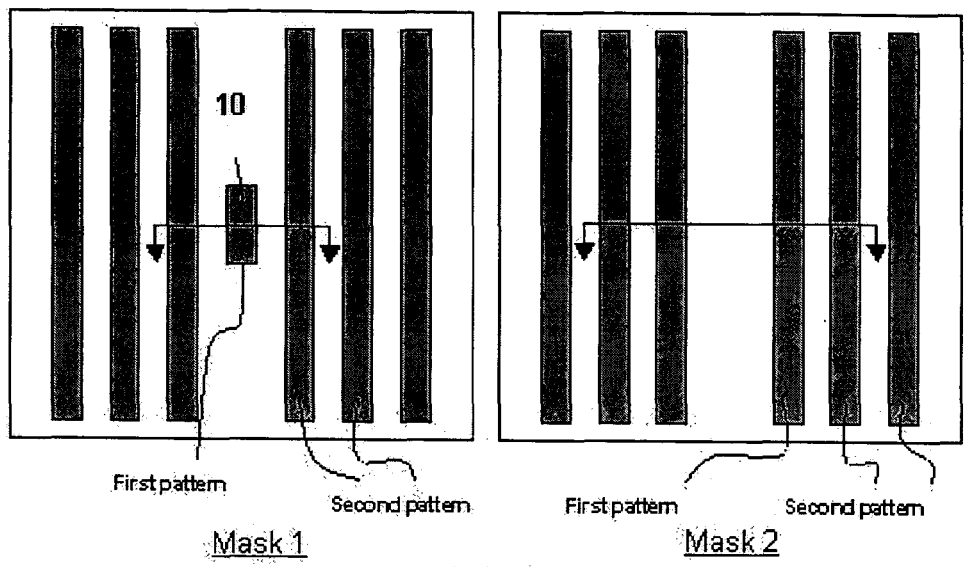
FIG. 1 is a top schematic diagram of first and second masks showing patterns which may exhibit iso-to-dense bias and edge-to-dense bias.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of photomasks. The present invention may be practiced in conjunction with various photomask fabrication techniques that are conventionally used in the art, and only so much of the commonly practiced process steps are included herein as are necessary to provide an understanding of the present invention. The present invention has applicability in the field of photomask fabrication in general. For illustrative purposes, however, the following description pertains to halftone photomask fabrication.

In accordance with the present invention, a mask having multi-transmittance patterns may be implemented to overcome line edge shortening, iso-to-dense bias and edge-to-dense bias issues. FIG. 1 shows top views of two masks used to determine the extent of line edge shortening, iso-to-dense bias and edge-to-dense bias issues. Mask 1 has a center structure 10. Because the center structure 10 is smaller than its adjacent pattern lines, Mask 1 can be used to measure for example iso-to-dense bias. Mask 2 lacks the center structure 10 of Mask 1. The gap between the centerlines of Mask 2 allows measurement of edge-to-dense bias.

A variety of steps are typically implemented in fabricating photomasks. An initial step involves storing a circuit pattern to a writing tool. The writing tool will etch the required pattern into the photomask blanks. Photomask blanks are typically made of transparent substrates, e.g. quartz, with thin layers of metal or metal alloy deposited on them. Before patterning, the photomask blanks are covered with anti-reflective coatings and photoresist. The circuit patterns are written to the photoresist on the photomasks via laser beam or electron beam pattern generating systems. Similarly to photoresists for wafers, the molecules of the exposed portions of the photoresist for photomasks are changed by the laser beam or electron beam. The photoresist is then developed wherein the exposed portions of the photoresist dissolve to leave patterns on the photomasks to be etched.

The etching process is a chemical process that selectively etches the metal/metal alloy versus the photoresist. The etching process may comprise wet etching in which the photomasks are submerged into chemical baths that etch away the exposed metal/metal alloy beneath the removed photoresist, or dry etching in which the exposed metal/metal alloy is removed via reactive chemical species and physical bombardment. Since the pattern accuracy of the photomasks is critical for future robust wafer processing, the photomasks are inspected for defects. If any defects are present, the photomasks are repaired if possible. For example, if the defect is an area of missing metal/metal alloy, the metal/metal alloy can be selectively deposited into that area. Once the patterns are repaired, the photomasks are typically measured for critical dimensions (CDs) and pattern sizes, cleaned, and inspected for the second time.

Figure 2:
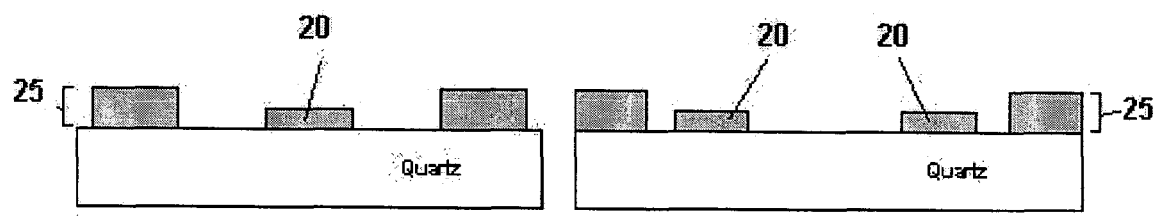
FIG. 2 shows cross-sectional views of masks having patterns corresponding to those of FIG. 1 in accordance with a first illustrated embodiment of the present invention.

FIG. 2 comprises cross-sectional views of first and second masks having patterns corresponding to those of FIG. 1 in accordance with a first illustrated embodiment of the present invention. Each of the two masks comprises a transparent substrate. The transparent substrate may comprise quartz or any other suitable or compatible material. A first pattern is formed on the transparent substrate and a second pattern is formed on the transparent substrate, wherein the second pattern is larger (e.g., longer) or denser than the first pattern. The first pattern has a first transmittance and the second pattern has a second transmittance, wherein the first transmittance is higher than the second transmittance. As used herein, the term "transmittance" refers to the ratio of radiant energy transmitted to the total radiant energy incident on a given body (e.g., a pattern).

On each of the two masks, the first pattern 20 is formed of a halftone material to a first thickness and the second pattern 25 is formed of the halftone material to a second thickness 25. The second thickness 25 is greater than the first thickness 20 since in accordance with an aspect of the present invention the second transmittance is selected to be less than the first transmittance. A thick layer can be deposited and etched twice to obtain the two thicknesses, and an etch stop layer can be inserted between the two layers to facilitate an etch stop process. As an alternative to the etch stop layer, precise pattern thicknesses can be controlled by precisely timing the etches. The halftone material may comprise one of MoSi (molybdenum-silicon) and MoSiN (molybdenum silicon nitride). In accordance with the illustrated embodiment, a first transmittance of about 27% and a second transmittance of about 6% has been found to provide at least one of improved critical dimension uniformity (CDU), reduced iso-to-dense bias, reduced edge-to-dense bias, reduced line end shortening, and an enlarged common window.

Figure 3:
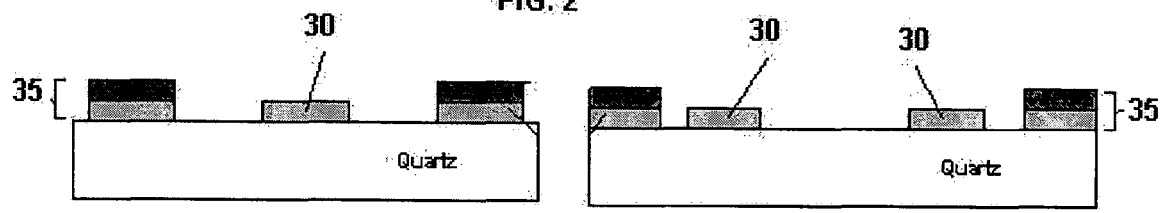
FIG. 3 shows cross-sectional views of masks having patterns corresponding to those of FIG. 1 in accordance with a second illustrated embodiment of the present invention.

Cross-sectional views of first and second masks having patterns corresponding to those of FIG. 1 in accordance with a second illustrated embodiment of the present invention are shown in FIG. 3. As with the embodiments of FIG. 2, the first and second masks comprise transparent substrates and the transparent substrates may comprise quartz or any other compatible material. A first pattern is formed on the transparent substrate and a second pattern is formed on the transparent substrate, wherein the second pattern is longer or denser than the first pattern. The first pattern has a first transmittance and the second pattern has a second transmittance, wherein the first transmittance is higher than the second transmittance to a degree sufficient to facilitate at least one of the following: an improved critical dimension uniformity, a reduced iso-to-dense bias, a reduced edge-to-dense bias, a reduced line end shortening, and an enlarged common window. As presently embodied, the first pattern is a single-layer halftone material layer 30 and the second pattern is a double-layer halftone material layer 35. The single-layer halftone material layer 30 may comprise one of (a) a MoSi (molybdenum-silicon) layer and (b) a MoSiN (molybdenum silicon nitride) layer. The double-layer halftone material layer 35 may comprise one of (a) a MoSi—RuO double layer and (b) a MoSiN—RuO double layer. In the illustrated embodiment, the first transmittance is selected to be about 27% and the second transmittance is selected to be about 6%.

Figure 4:
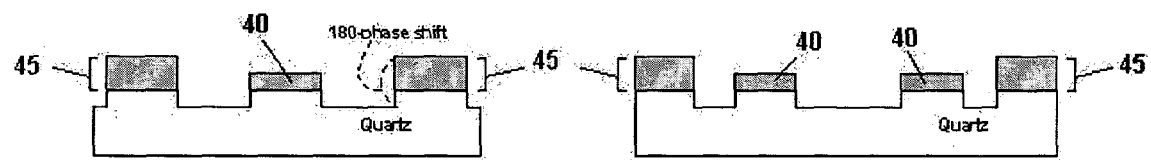
FIG. 4 shows cross-sectional views of masks having patterns corresponding to those of FIG. 1 in accordance with a third illustrated embodiment of the present invention.

FIG. 4 depicts cross-sectional views of two masks having patterns corresponding to those of FIG. 1 in accordance with a third illustrated embodiment of the present invention. Similarly to the above-described embodiments, each of the masks comprises a transparent substrate which may comprise quartz or any other compatible material. A first pattern is formed on the transparent substrate and a second pattern is formed on the transparent substrate, wherein the second pattern is longer or denser than the first pattern. The first pattern has a first transmittance and the second pattern has a second transmittance, wherein the first transmittance is higher than the second transmittance. The first pattern is formed to a first thickness of a halftone material 40 with 180-degree phase shift and the second pattern is formed to a second thickness 45 of the halftone material with 180-degree phase shift. The second thickness 45 is greater than the first thickness since in accordance with a feature of the present invention the second transmittance is set to be less than the first transmittance, in order to provide at least one of an improved critical dimension uniformity, a reduced iso-to-dense bias, a reduced edge-to-dense bias, a reduced line end shortening, and an enlarged common window. In the illustrated embodiment, the first pattern is formed to have a first transmittance of about 27% and the second pattern is formed to have a second transmittance of about 6%.

Figure 5:
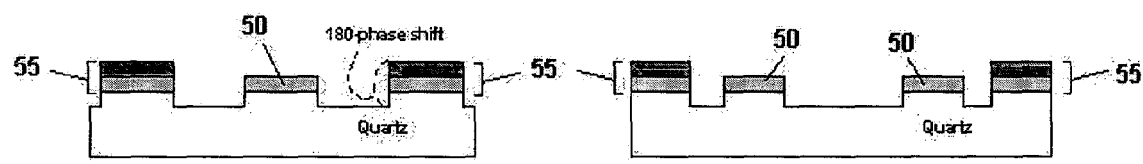
FIG. 5 shows cross-sectional views of masks having patterns corresponding to those of FIG. 1 in accordance with a fourth illustrated embodiment of the present invention.

Referring to FIG. 5, cross-sectional views of first and second masks having patterns corresponding to those of FIG. 1 are shown in accordance with a fourth illustrated embodiment of the present invention, wherein each of the two masks comprises a transparent substrate of for example quartz. A first pattern is formed on the transparent substrate and a second pattern is formed on the transparent substrate, wherein the second pattern is longer or denser than the first pattern. The first pattern has a first transmittance and the second pattern has a second transmittance, wherein the first transmittance is higher than the second transmittance. The first pattern is a single-layer halftone material layer 50 with 180-degree phase shift and the second pattern is a double-layer halftone material layer 55 with 180-degree phase shift.

In the illustrated embodiment, the single-layer halftone material layer 50 may comprise, for example, one of (a) a MoSi (molybdenum-silicon) layer and (b) a MoSiN (molybdenum silicon nitride) layer. Furthermore, in the illustrated embodiment, the double-layer halftone material layer 55 may comprise, for example, one of (a) a MoSi—RuO double layer and (b) a MoSiN—RuO double layer. In modified embodiments, other materials may be selected for the single-layer halftone material layer 50 and/or the double-layer halftone material layer 55, so long as one or more of an improved critical dimension uniformity, a reduced iso-to-dense bias, a reduced edge-to-dense bias, a reduced line end shortening, and an enlarged common window are obtained. As presently embodied, the first transmittance of the single-layer halftone material layer is about 27% and the second transmittance of the double-layer halftone material layer is about 6%, but as with the above described embodiments other combinations and/or ratios of transmittances may be implemented in modified embodiments of the invention so long as, for example, one or more of the benefits mentioned in the preceding sentence are obtained.

Figure 6:
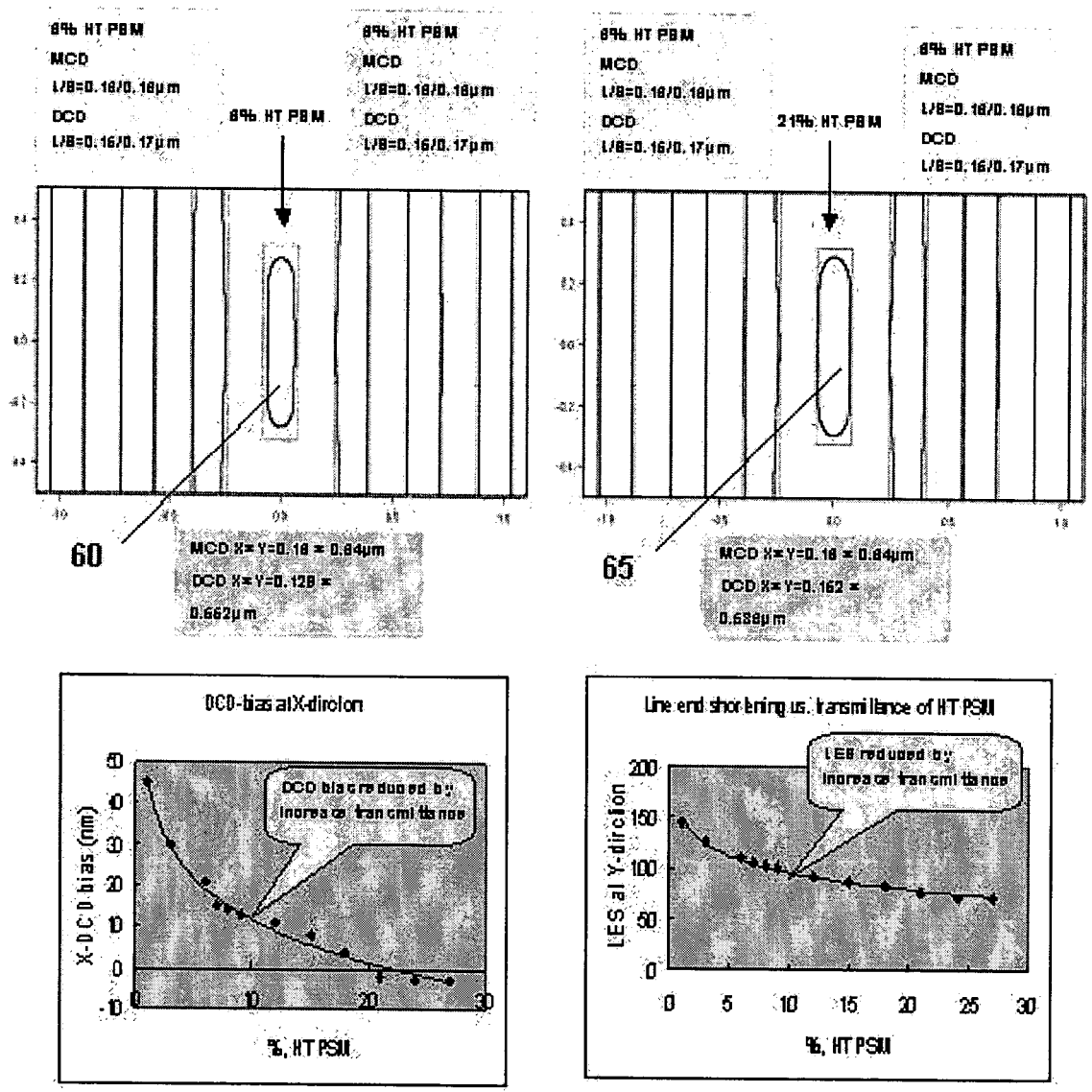
FIG. 6 compares iso-to-dense bias resulting from the use of single transmittance masks versus the use of multi-transmittance halftone phase shift masks of the present invention.

FIG. 6 shows simulation data for iso-to-dense bias. The profile on the left shows how the photoresist profile may appear when Mask 1 exhibits one transmittance of 6% while the profile on the right shows how the photoresist profile may appear when Mask 1 exhibits a 21% transmittance for the isolated region 65 and a 6% transmittance for the dense line regions on both sides of the isolated region 65. The critical dimension (CD) of the dense line regions on both sides of isolated region 60 and the CD of the dense line regions on both sides of the isolated region 65 show line and space widths of 0.15 to 0.17 $\mu$m. The line width of the isolated region 60, however, is significantly smaller than the line width of the isolated region 65. Moreover, there is more line edge shortening of the isolated region 60 than of the isolated region 65. The Mask 1 on the right would appear to show that the iso-to-dense bias and the line end shortening can be improved when the presently described multi-transmittance photomasks are used in lieu of single transmittance photomasks.

Figure 7A:
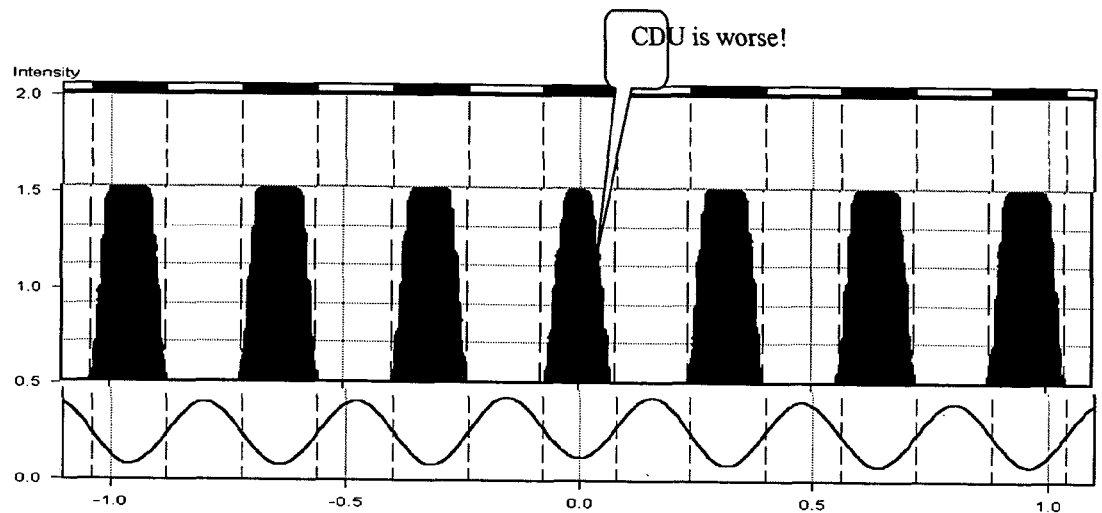
FIGS. 7A and B compares critical dimension uniformity resulting from the use of single transmittance masks versus the use of multi-transmittance halftone phase shift masks for iso-to-dense bias induced structures.
Figure 7B:
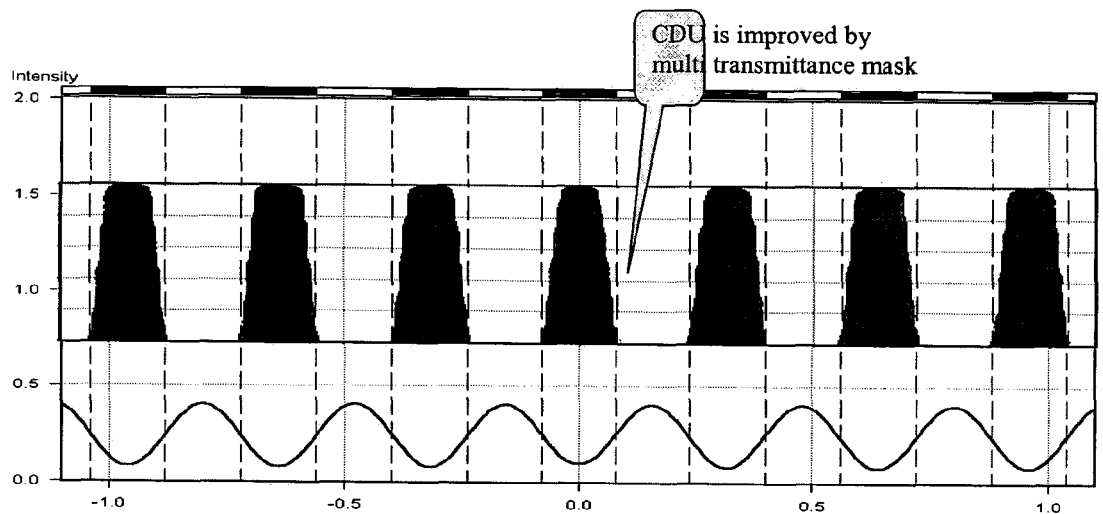

Critical dimension uniformity (CDU) is a measurement of how uniform the critical dimensions are from structure to structure. FIG. 7A and FIG. 7B show the photoresist profiles resulting from a Mask 1 construction of only one transmittance of 6% and from a Mask 1 construction of a 21% transmittance for the isolated region 65 versus a 6% transmittance for the dense line regions on both sides of the isolated region 65, respectively. The line width of the isolated structure 65 is similar to the line widths of its adjacent dense lines. The line width of the isolated structure 60, however, is less similar to the line widths of its adjacent dense lines. Therefore, the critical dimension uniformity of the photoresist profiles using multi-transmittance photomasks would appear to be better than the critical dimension uniformity of the photoresist profiles using single transmittance masks.

The simulation data shown in FIGS. 8A–8C demonstrates an apparent improvement of edge-to-dense bias. The vertical axes of the graphs represent exposure dose while the horizontal axes of the graphs represent amount of defocus. Each graph depicts the exposure and defocus limits for two sets of structures: center structures and size dependent structures. The overlap of the two regions for the two sets of structures represents the optimum settings for the stepper to resolve both the center structures and the size dependent structures. The rectangular region on each graph is the largest rectangular region within the overlap and is often called the common window. Larger common windows generally indicate better photolithography process stability.

FIG. 8A shows the common window for the use of single transmittance masks of 6% transmittance. FIG. 8B shows that the common window grows considerably when 18% transmittance is employed along the edges of the regions of dense lines in the photomask while simultaneously having 6% transmittance for the interiors of the regions of dense lines, whereby a significant improvement would appear to be achieved over the use of single transmittance masks. FIG. 8C shows that the common window grows slightly more when the 18% transmittance of FIG. 8B is changed to a 21% transmittance. Therefore, the use of multi-transmittance photomasks would appear to improve the common window compared to the use of single transmittance masks.

Figure 9:
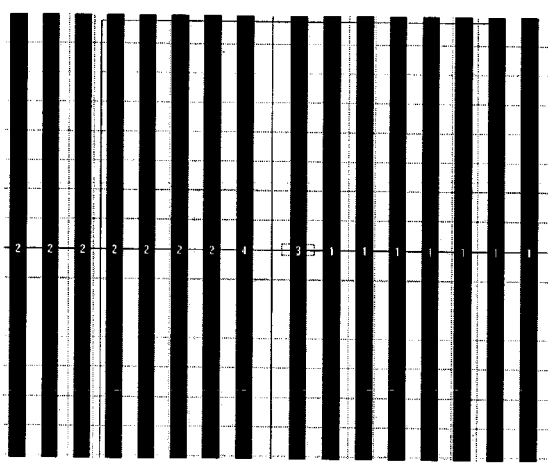
FIG. 9 shows variations of edge line critical dimension and dense-to-edge bias for halftone phase shift masks of different transmittances.
Figure 9:
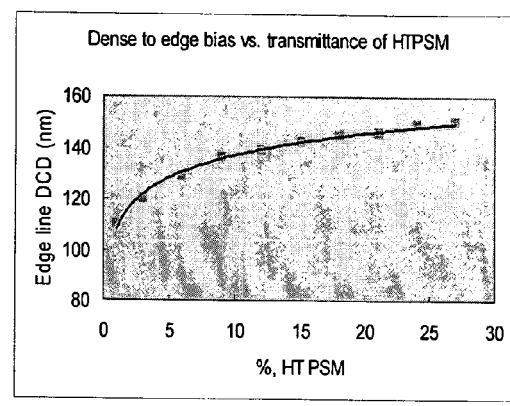
Figure 9:
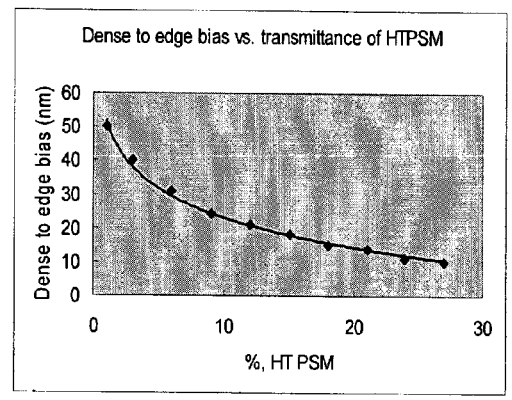

FIG. 9 shows how edge-to-dense bias and edge line CD change as the relevant transmittances of the multi-transmittance halftone phase change photomasks are varied. Higher transmittance increases the edge line CD and decreases the edge-to-dense bias.

Figure 10A:
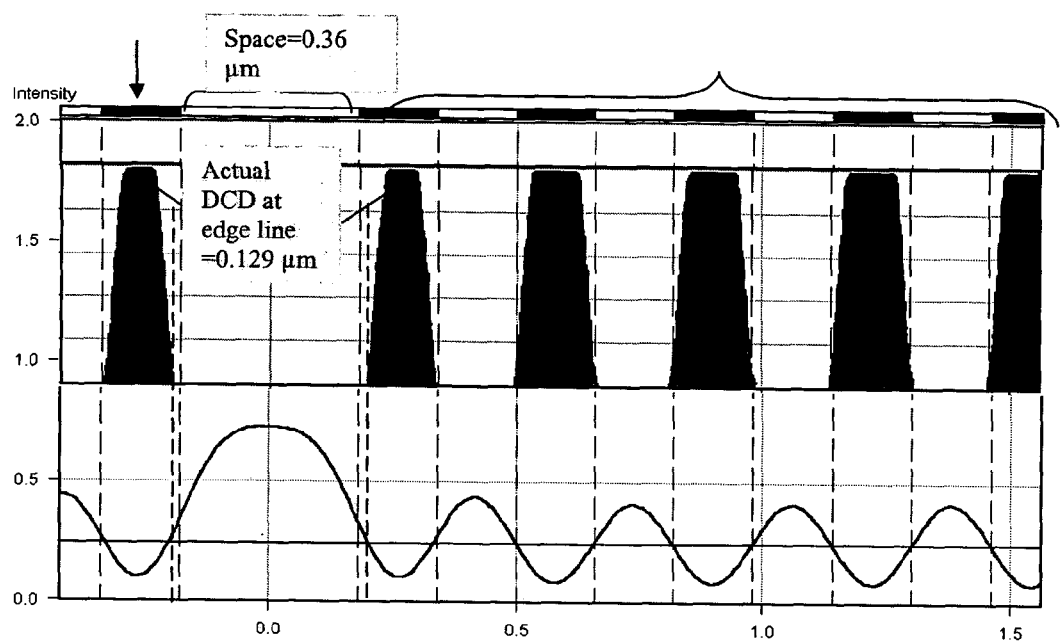
FIGS. 10A and B compares critical dimension uniformity resulting from the use of single transmittance masks versus the use of multi-transmittance halftone phase shift masks for edge-to-dense bias induced structures.
Figure 10B:
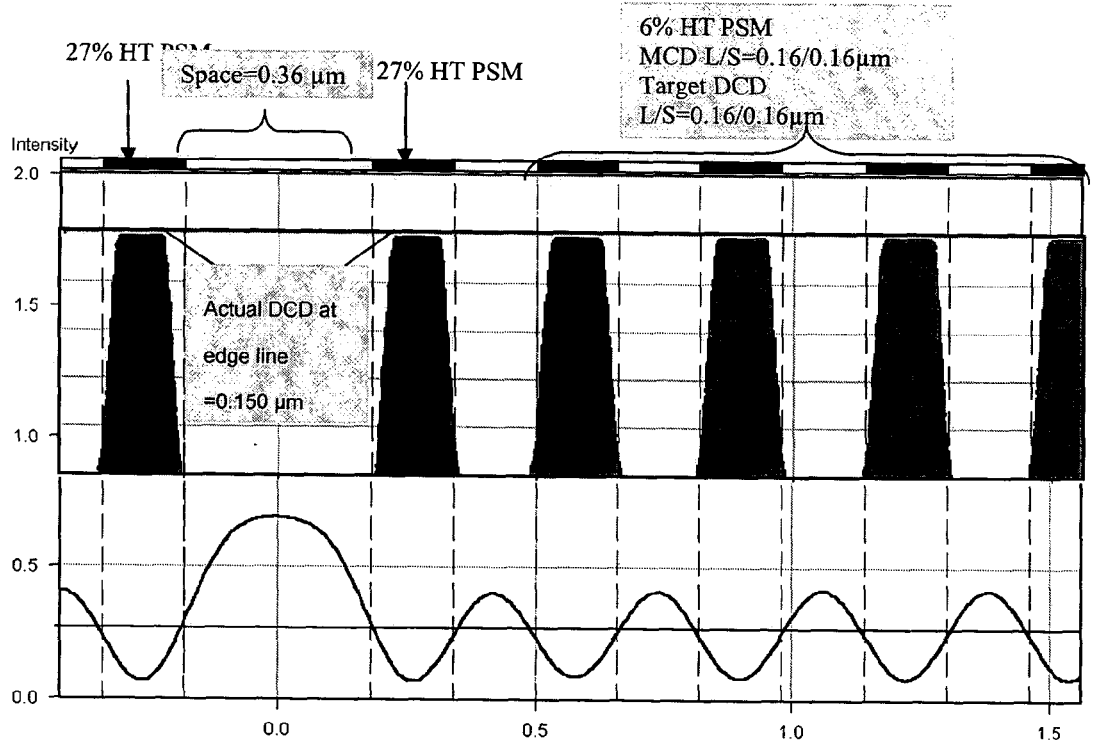

FIG. 10A and FIG. 10B show the photoresist profiles resulting from a Mask 2 having one transmittance of 6% and from a Mask 2 having a 27% transmittance for both (a) isolated regions and (b) the edges of regions of dense lines in the photomask versus a 6% transmittance for the interiors of the regions of dense lines, respectively. The line widths of the edges of the regions of dense lines and of the isolated region in FIG. 10B are similar to the line widths of lines within the region of dense lines. The line widths of the interiors of the regions of dense lines, however, are less similar to the line widths of their adjacent dense lines and to the width of the isolated line in FIG. 10A. Therefore, the critical dimension uniformity of the photoresist profiles using multi-transmittance photomasks would appear to better than the critical dimension uniformity of the photoresist profiles using single transmittance masks.

Figure 11:
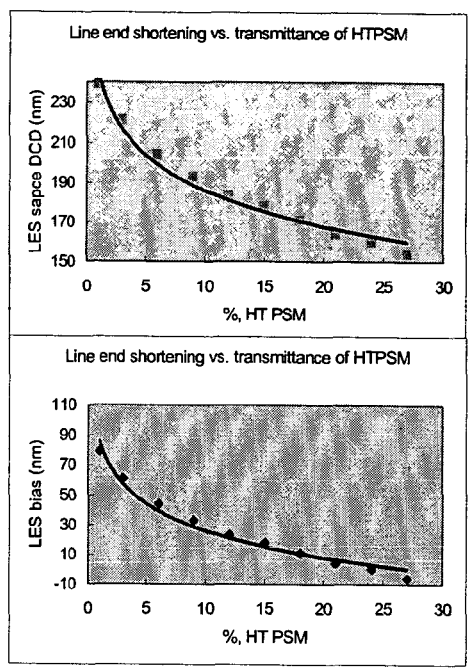
FIG. 11 shows the effect of line edge shortening of adjacent lines with varying transmittance between the lines.
Figure 11:
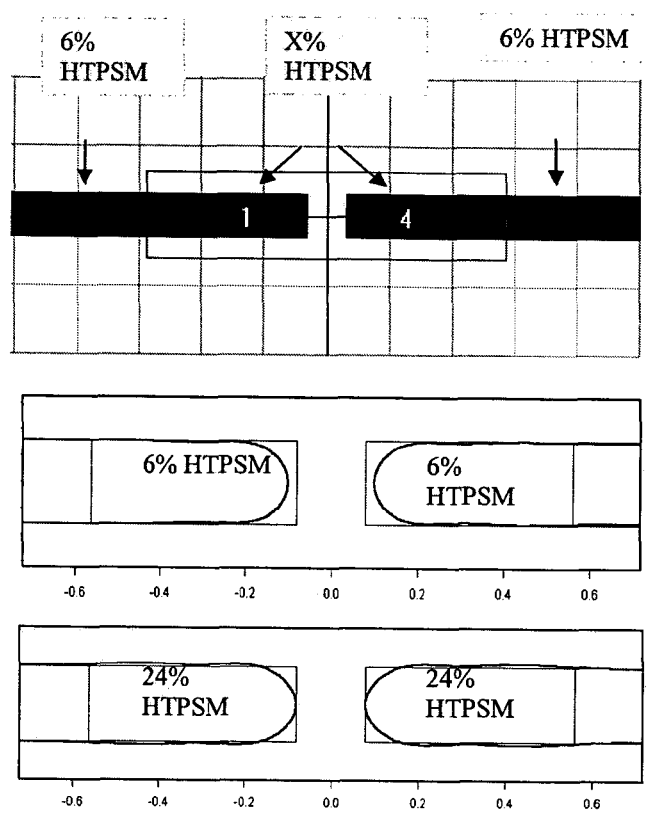

FIG. 11 shows another example of the effect of multi-transmittance on line end shortening. When the ends of two lines are close together, using the higher transmittance of 24% on the ends would appear to reduce the line end shortening significantly compared to using 6% transmittance everywhere.

Since only one mask and only one exposure step may be required in photolithography processes employing the masks of the present invention, the photolithography processes can be simpler and more cost effective than photolithography processes using multiple masks and multiple exposure steps of a single transmittance. Therefore, the foregoing issues of line end shortening, critical dimension uniformity, iso-to-dense bias, and edge-to-dense bias may be reduced with a single exposure process with the inventive masks, perhaps as well or better than with multiple masks of single transmittance and multiple exposure steps. Moreover, overlay issues can be attenuated or eliminated.

In view of the foregoing, it will be understood by those skilled in the art that the methods of the present invention can facilitate formation of photomasks, and in particular of multi-transmittance halftone phase change photomasks. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A mask, having transparent areas forming spaces and partially transparent areas forming objects, the mask comprising:
    a transparent substrate having a full transmittance and having spaces defined thereon with the same full transmittance and with the same phase-shift value;
    a first pattern of objects having a first partial transmittance and a first phase-shift value, formed on the transparent substrate; and
    a second pattern of objects having a second partial transmittance and a second phase-shift value equal to the first phase-shift value, formed on the transparent substrate, wherein the second pattern is longer or denser than the first pattern, and the first partial transmittance is higher than the second partial transmittance.

2. The mask of claim 1, wherein:
    the first pattern is formed to have a first thickness of a halftone material;
    the second pattern is formed to have a second thickness of the halftone material; and
    the second thickness is greater than the first thickness.

3. The mask of claim 1, wherein:
    the first pattern is a single-layer halftone material layer; and
    the second pattern is a double-layer halftone material layer.

4. The mask of claim 2, wherein:
    the first pattern is a first thickness of a halftone material with 180-degree phase shift and the second pattern is a second thickness of the halftone material with 180-degree phase shift; and
    the second thickness is greater than the first thickness.

5. The mask of claim 3, wherein:
    the first pattern is a single-layer halftone material layer with 180-degree phase shift; and
    the second pattern is a double-layer halftone material layer with 180-degree phase shift.

6. The mask of claim 1, wherein the first transmittance is about 27%.

7. The mask of claim 1, wherein the second transmittance is about 6%.

8. The mask of claim 2, wherein the halftone material comprises a MoSi layer.

9. The mask of claim 2, wherein the halftone material comprises a MoSiN layer.

10. The mask of claim 3, wherein the single-layer halftone material layer comprises a MoSi layer.

11. The mask of claim 3, wherein the single-layer halftone material layer comprises a MoSiN layer.

12. The mask of claim 3, wherein the double-layer halftone material layer comprises a MoSi—RuO double layer.

13. The mask of claim 3, wherein the double-layer halftone material layer comprises a MoSiN—RuO double layer.

14. A photomask, comprising:
    a first pattern of objects having a first partial transmittance and a phase-shift value:
    a second pattern of objects having a second partial transmittance and the same phase-shift value, the second pattern being longer or denser than the first pattern and the first transmittance being higher than the second transmittance; and spaces disposed between the objects of the first pattern and the second pattern the spaces having full transmittances and the same phase-shift value.

15. The mask of claim 14, wherein:
the first pattern is a formed of a halftone material to have a first thickness;
the second pattern is formed of the halftone material to have a second thickness; and
the second thickness is greater than the first thickness.

16. The mask of claim 14, wherein:
the first pattern is a single-layer halftone material layer; and
the second pattern is a double-layer halftone material layer.

17. The mask of claim 15, wherein:
the first pattern is a first thickness of a halftone material with 180-degree phase shift;
the second pattern is a second thickness of the halftone material with 180-degree phase shift; and
the second thickness is greater than the first thickness.

18. The mask of claim 16, wherein:
the first pattern is a single-layer halftone material layer with 180-degree phase shift; and
the second pattern is a double-layer halftone material layer wit 180-degree phase shift.

19. The mask of claim 14, wherein the first transmittance is about 27%.

20. The mask of claim 14, wherein the second transmittance is about 6%.

* * * * *